(12) United States Patent
Johnson

(10) Patent No.: US 8,267,805 B2
(45) Date of Patent: Sep. 18, 2012

(54) THREE IN ONE-HBC(HAND, BELLY, CHEST) PUTTER

(76) Inventor: Lyle Dean Johnson, Belmont, CA (US)

(*) Notice: Subject to any disclaimer, the term of this patent is extended or adjusted under 35 U.S.C. 154(b) by 0 days.

(21) Appl. No.: 12/807,837

(22) Filed: Sep. 14, 2010

(65) Prior Publication Data
US 2011/0081983 A1   Apr. 7, 2011

Related U.S. Application Data

(60) Provisional application No. 61/247,641, filed on Oct. 1, 2009.

(51) Int. Cl.
A63B 53/16 (2006.01)
(52) U.S. Cl. .......................................................... 473/296
(58) Field of Classification Search .................. 473/239, 473/293–299
See application file for complete search history.

(56) References Cited

U.S. PATENT DOCUMENTS

| | | | |
|---|---|---|---|
| 1,704,544 A * | 3/1929 | Novak | 473/299 |
| 5,452,891 A | 9/1995 | Thomas | |
| 5,485,999 A | 1/1996 | Hull | |
| 5,649,870 A | 7/1997 | Harrison | |
| 5,947,837 A | 9/1999 | Perry | |
| 6,068,562 A * | 5/2000 | Hedges | 473/409 |
| 6,280,346 B1* | 8/2001 | Gedeon | 473/293 |
| 6,371,866 B1* | 4/2002 | Rivera | 473/288 |
| 6,723,000 B1 | 4/2004 | Dombrowski | |
| 6,896,626 B2 | 5/2005 | Drossos | |
| 7,147,568 B1 | 12/2006 | Butler | |
| 7,172,514 B2* | 2/2007 | Benson | 473/239 |
| 7,422,526 B2* | 9/2008 | Nemeckay | 473/296 |
| 7,431,663 B2* | 10/2008 | Pamias | 473/288 |
| 7,544,134 B1* | 6/2009 | Harmon et al. | 473/206 |
| 7,704,159 B1* | 4/2010 | McDonald | 473/296 |
| 2003/0050131 A1* | 3/2003 | Grace | 473/296 |
| 2003/0207723 A1* | 11/2003 | Jacoby | 473/298 |
| 2004/0048679 A1* | 3/2004 | Bunting | 473/226 |
| 2004/0087385 A1 | 5/2004 | Murray | |
| 2004/0116197 A1* | 6/2004 | Benson | 473/239 |
| 2004/0198528 A1 | 10/2004 | Balcer | |
| 2005/0143186 A1* | 6/2005 | Blattner et al. | 473/296 |
| 2005/0227776 A1* | 10/2005 | Benson | 473/239 |
| 2006/0040762 A1* | 2/2006 | Chupka et al. | 473/293 |
| 2006/0183563 A1* | 8/2006 | Nemeckay | 473/239 |
| 2008/0167139 A1 | 7/2008 | Grussbord | |
| 2009/0062031 A1* | 3/2009 | Holtzman | 473/307 |
| 2009/0270197 A1* | 10/2009 | Holtzman | 473/296 |

* cited by examiner

*Primary Examiner* — Stephen L. Blau

(57) ABSTRACT

A "THREE IN ONE—HBC(HAND, BELLY, CHEST) PUTTER" is comprised of three putters that can be assembled from the individual parts in the putter package. A combination putter can be used in any of the three forms, hand, belly or chest for the next round of practice or golf. After each round of golf the golfer may change the configuration to any of the other putter forms for the next round of practice or golf.

7 Claims, 6 Drawing Sheets

THREE IN ONE-HBC(HAND, BELLY, CHEST) PUTTER

CROSS-REFERENCE TO RELATED APPLICATIONS

This is a completion patent application of co-pending U.S. Provisional Patent Application Ser. No. 61/247,641 filed Oct. 1, 2009.

BACKGROUND OF THE INVENTION

1. Field of Invention

The present invention generally pertains to the development of a combination golf putter that can be used as a conventional hand putter, a belly putter and a chest putter.

2. Prior Art

There have been a series of golf putter extenders, telescoping shafts and fitment systems developed over the years. One method of converting a regular hand putter into a belly or chest putter was an extender that is inserted into the handle of the hand putter. Once it was fixed in place it could no longer be removed eliminating the use of the club as a hand putter. Another type of extension was a telescoping handle with a rounded top. The extender is slid out of the handle to a chosen length and tightened into place. Although effective it was heavy and cumbersome and could not be converted into a chest putter. A special fitment system was developed that allowed an extension to be inserted into the hand putter for either a belly or chest putter configuration. The fitment system was difficult to assemble. Still another adjustable golf putter was developed that employed tubes that fit inside each other that could be slid in or out to the desired length and clamped in place. Gripping the club for putting was limited to specific areas and did not allow flexibility.

OBJECTS AND ADVANTAGES

A "Three in One Putter" has several advantages over other putter with extenders. First is the set of matching grips. Each extender has the same size rounded grip that simply serves as an extension of the other grip allowing the golfer to grasp the club anywhere along its length while putting. Although specific locations are desired flexibility is important to the golfer. Second are the couplers and set screws used in each shaft. The couplers for the belly extender and the chest extender are interchangeable, allowing the golfer to use the extenders in any order for a different length and feel. The set screws are simple to loosen or tighten with a slight turn using the Allan wrench. The set screw assures the club will be firmly held in place during a round of golf. Additionally the grips are soft yet firm to hold giving the golfer better feel in the putter process. Finally, the golfer has three putters they can use for practice and once they have gained proficiency in a specific unit can carry that club over for use on the golf course.

Figure 1:
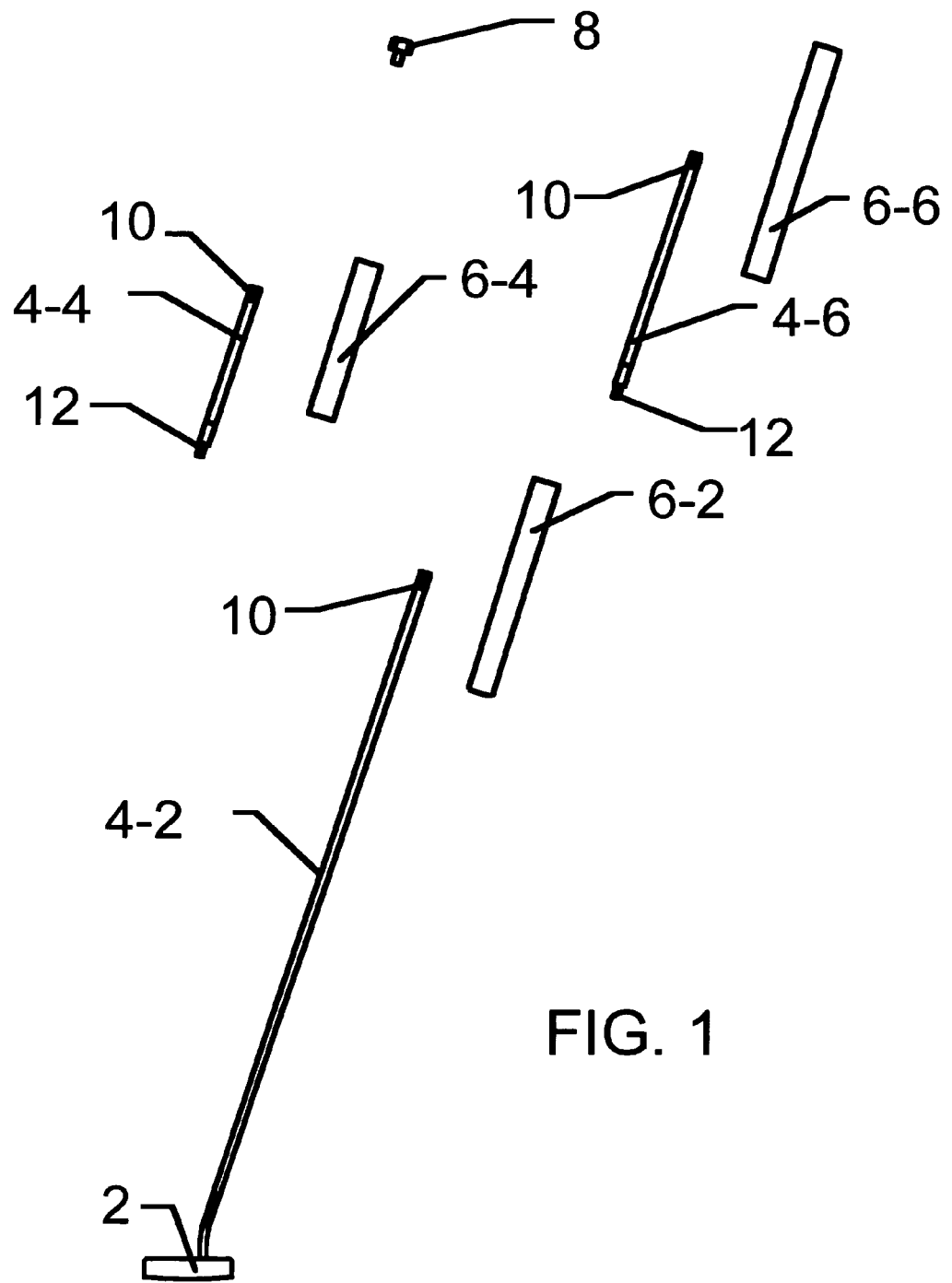
Figure 2:
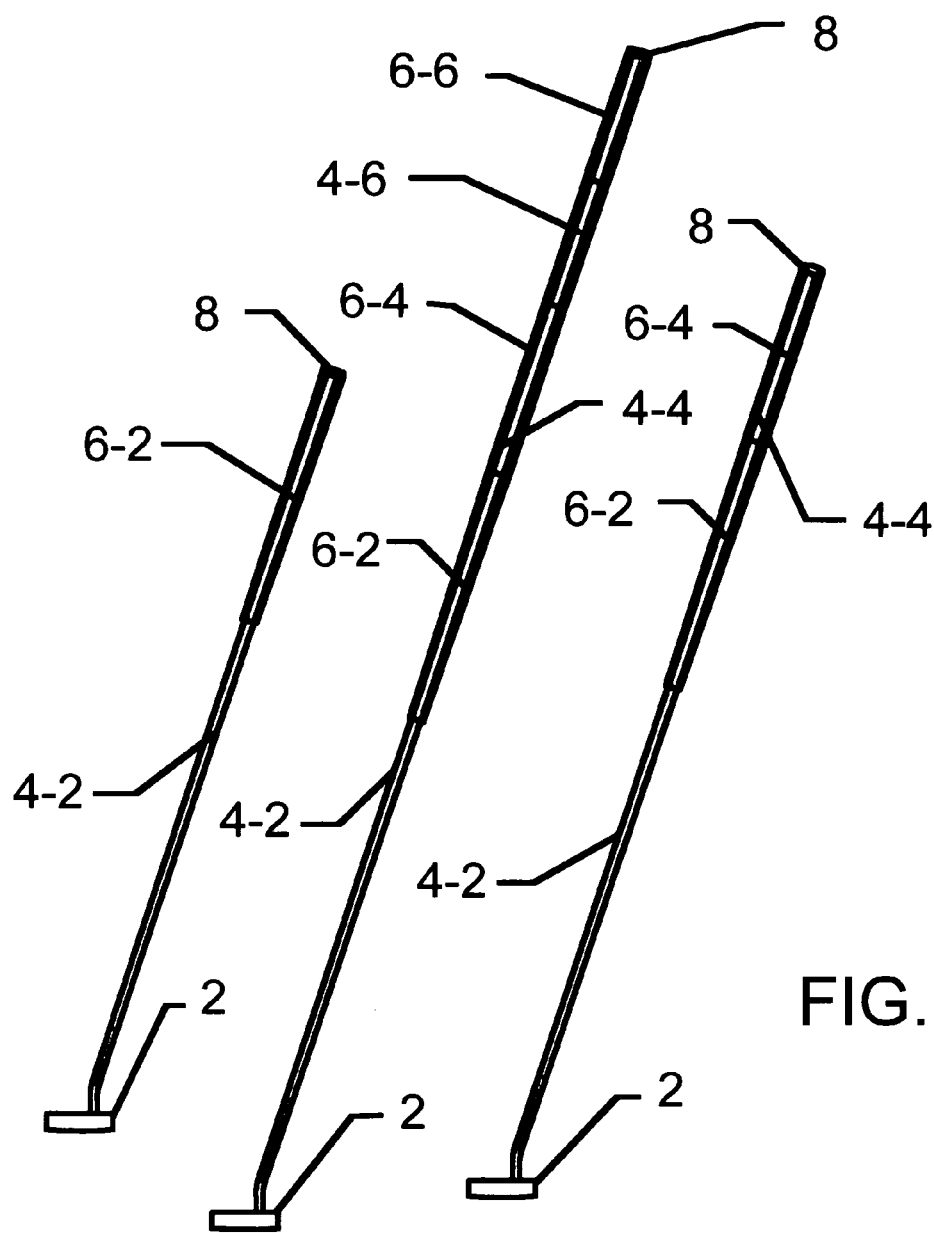
Figure 3:
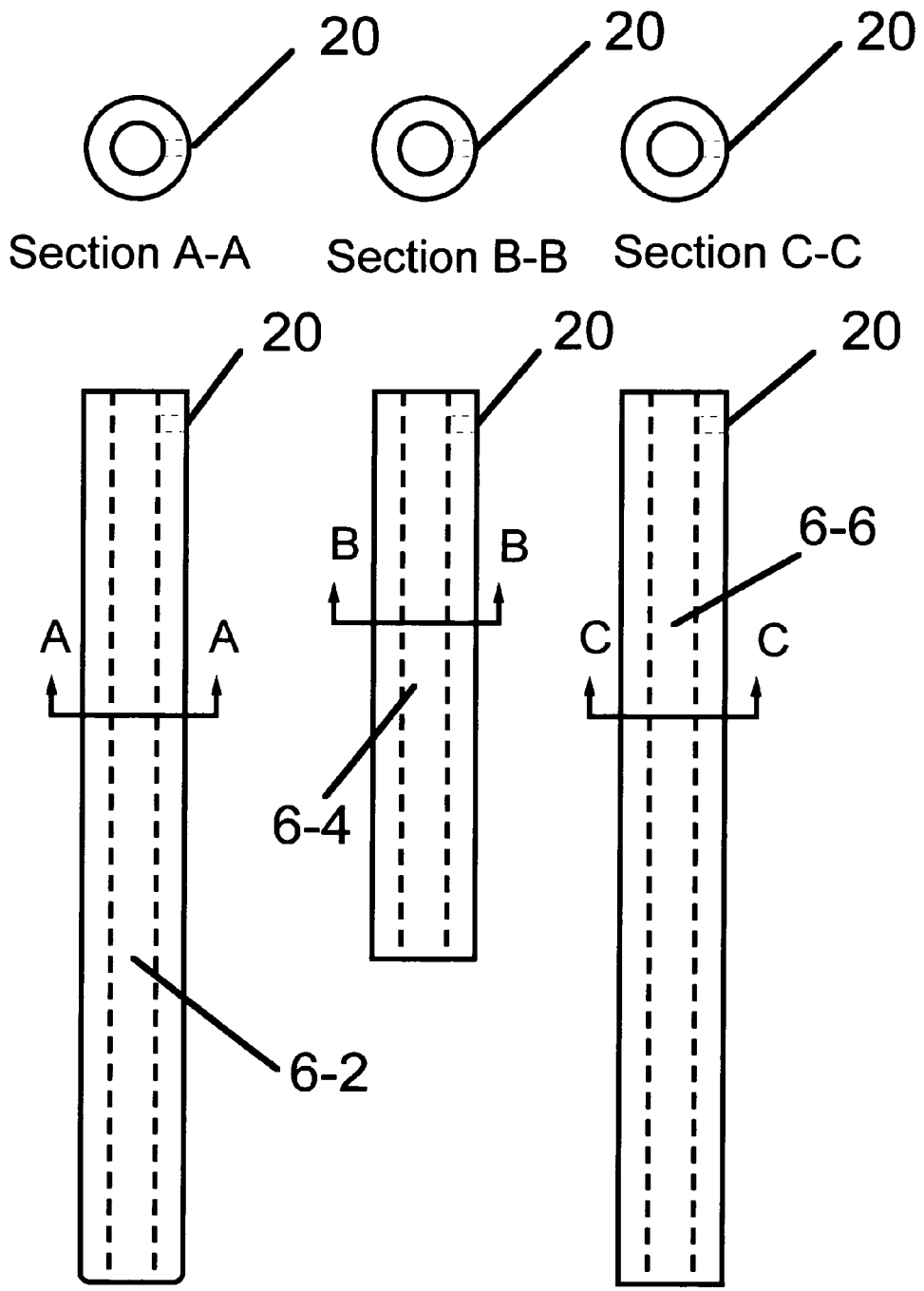
Figure 4:
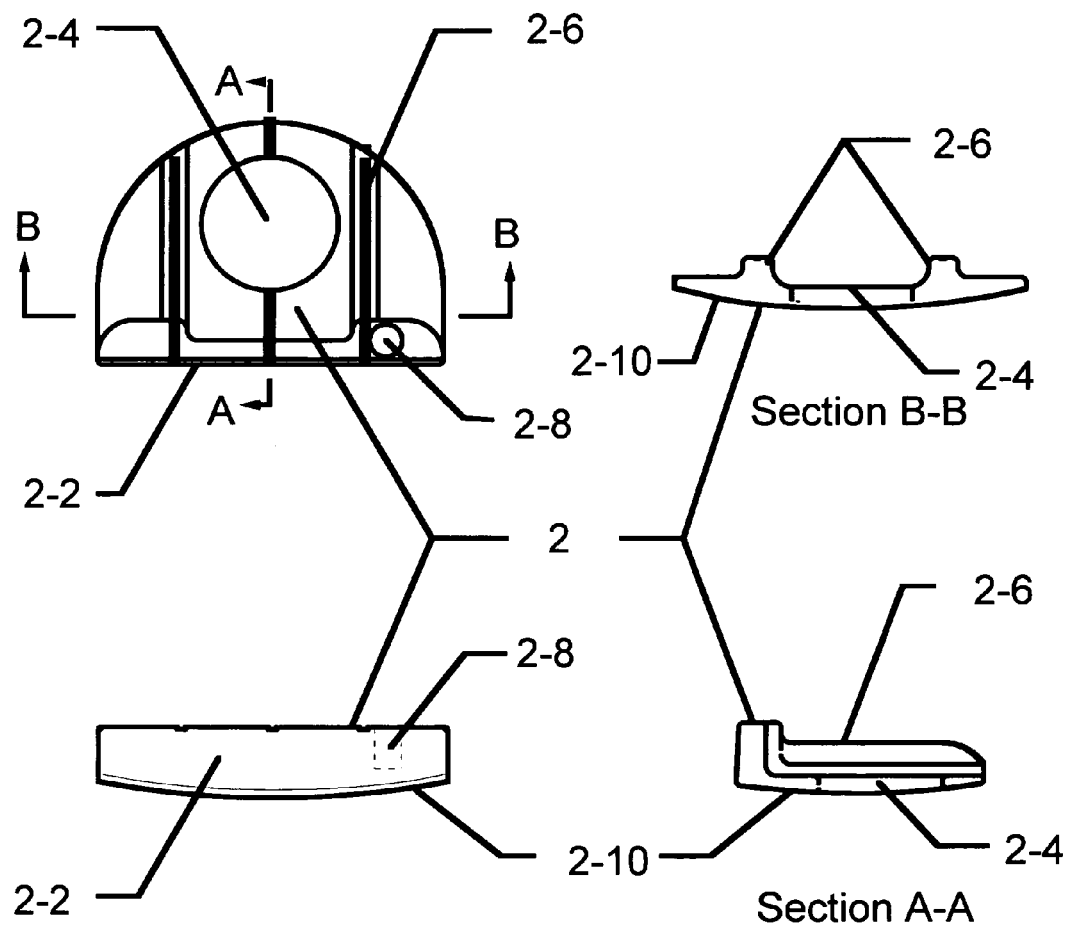
Figure 5:
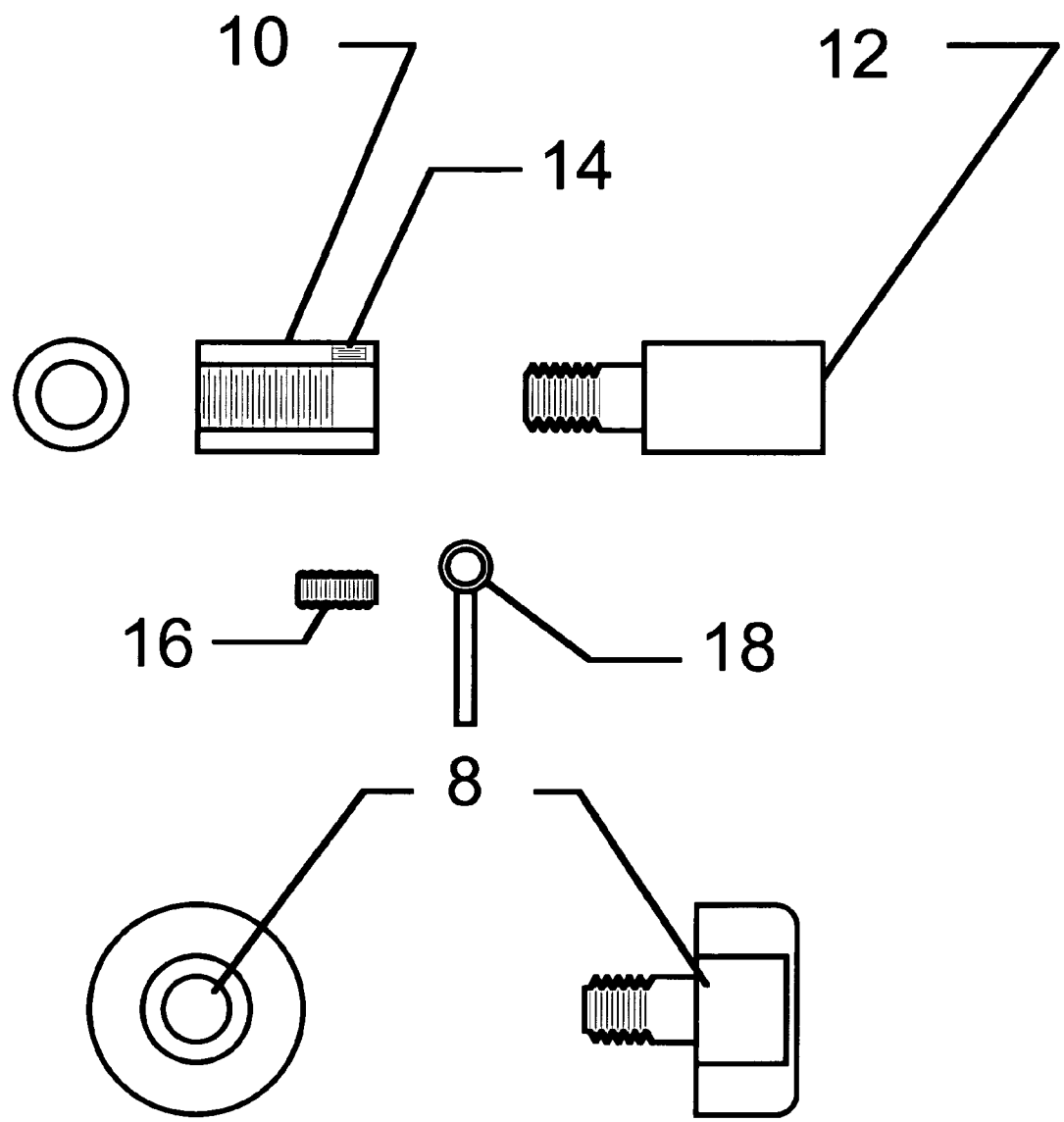
Figure 6:
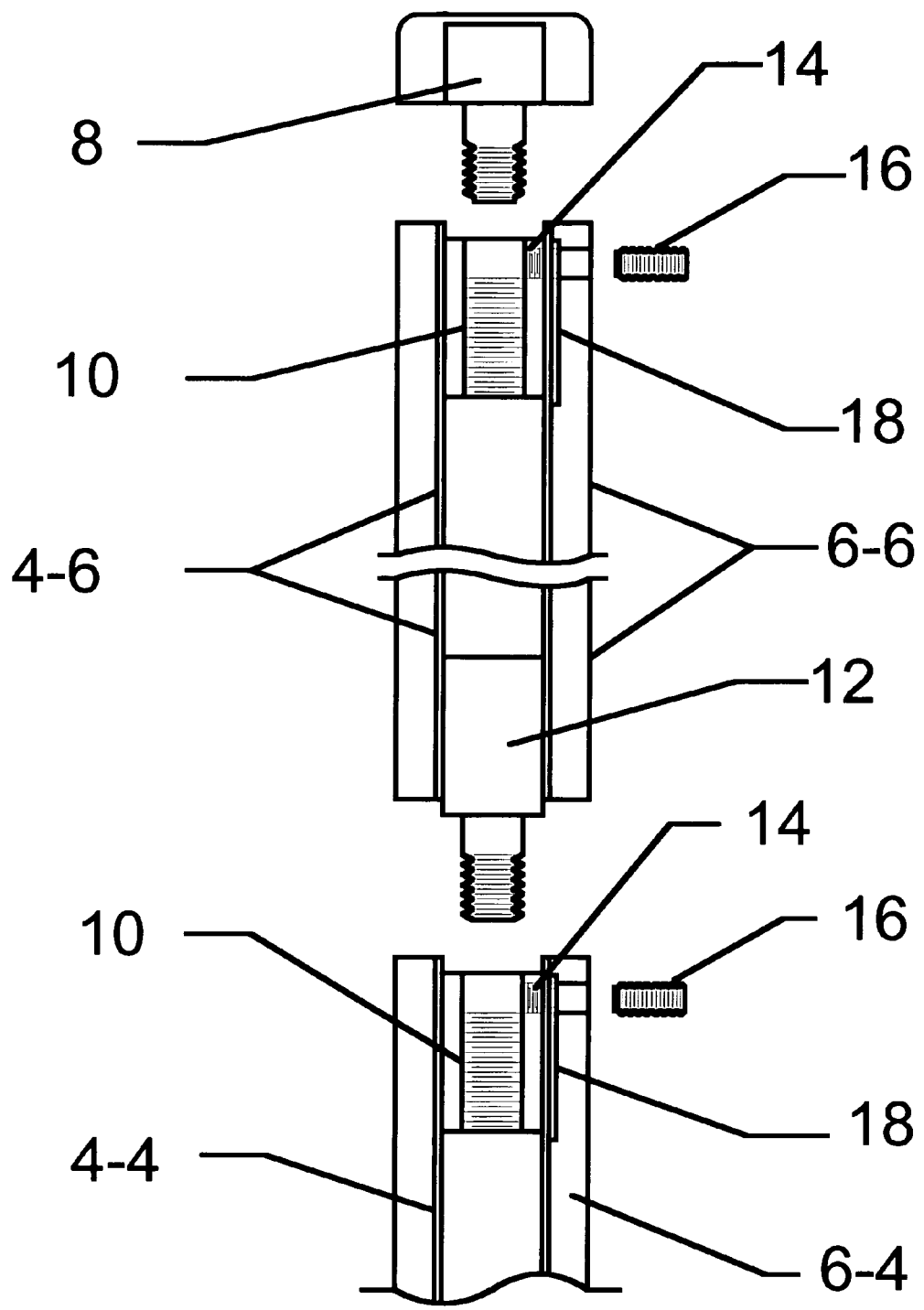

Drawings for the "Three In One Putter".
FIG. 1—The putter parts.
Includes all parts except details in FIG. 5
FIG. 2—The putters as assembled.
Shows the three assembled putters.
FIG. 3—The grips.
Shows the three grips lengths may vary for each golfer.
FIG. 4—The putter head.
Shows the putter head designed for the clubs
FIG. 5—The cap, set screws and couplers.
Details the fitness assembly parts
FIG. 6—Typical Method of Assembly.
Details the assembly for the shafts and grips.

LIST OF REFERENCE NUMERALS

2 Putter Head
2-2 Putter Face
2-4 Hole for ball guide and pickup
2-6 Balancing weights and parallel strips for putt alignment
2-8 Hole for putter shaft
2-10 Sole of putter
4-2 Shaft for hand putter
4-4 Shaft for belly putter
4-6 Shaft for chest putter
6-2 Grip for hand putter
6-4 Grip for belly putter
6-6 Grip for chest putter
8 Cap for end of each putter unit
10 Female coupler for each putter unit
12 Male coupler for each putter unit
14 Threaded tap for the set screw
16 Set screw with Allan wrench head
18 Set screw holder
20 Hole in Grips for set screw

SUMMARY OF INVENTION

Currently a golfer may purchase all three putters individually or in some combination with extenders, however, none are designed with unique interchangeable parts that give the golfer all three putters in one unit. By owning the "Three In One Putter" the golfer has the ability to assemble and disassemble each unit easily for use in practice and then in a round of golf. The club can then be easily disassembled for storage in the golf bag or left in its current condition and placed in the bag. Because each extension has a full length grip it creates the unique feature that allows the extenders for the belly and chest putters to be interchangeable and gives the golfer a chance to try different lengths for each unit. A purchaser may obtain additional extensions of various lengths if desired. It will be extremely advantages for the golfer to have all three putters at their disposal.

Description

Main Embodiment

The putter head 2 is properly weighted and balanced for striking the ball with each unit, hand, belly and chest. The putter head 2 balancing weights and parallel strips 2-6 and the hole for ball guide 2-4 are designed to assist the golfer in aligning the putt when putter face 2-2 strikes the ball. The hole for the ball guide and ball pickup 2-4 is also used to secure the ball when being picked up after play is completed on the green. The putter head 2 is connected to shaft 4-2 with shaft epoxy in the hole for putter shaft 2-8, in a vertical position. Shaft 4-2 is bent just above the putter head 2 at a designed degree of angle from vertical. A female coupler 10 is affixed, with epoxy, to the inside of the upper end of shaft 4-2 having the threaded tap 14 for the set screw 16 properly aligned with the hole in the back of shaft 4-2. The set screw holder 18 is then affixed with super glue to shaft 4-2 at the proper location where the set screw 16 can be screwed in place. The set screw 16 is removed and the grip for the hand putter 6-2 is now affixed to shaft 4-2 with grip tape. A hole 20 placed in grip 6-2 is aligned with the set screw holder 18. A cap 8 is now screwed into female coupler 10 and the set screw 16 is tightened with an Allen wrench to hold the cap 8 in place. This completes the hand putter unit of the "Three In One Putter". Cap 8 is removed using the Allen wrench to loosen it and now the belly putter extender can be installed. The belly putter extender is assembled as follows: a male coupler 12 is affixed with epoxy to the inside of the lower end of shaft 4-4 and a female coupler 10 is affixed with epoxy to the inside of the upper end of shaft 4-4 where the threaded set screw tap 14 is aligned with the hole in shaft 4-4. A set screw holder 18 is affixed with super glue at the proper location on shaft 4-4. A set screw 16 is used to align the set screw holder 18 which can now be removed before a grip for the belly putter extender 6-4 is affixed to shaft 4-6 with grip tape again aligning the hole 20 with the set screw holder 16. The shaft for the belly extender 4-4 is now ready to be screwed into the shaft of the hand putter 4-2. After the shaft for the belly putter 4-4 has been tightly screwed into place the set screw 16 is tightened using the Allen wrench to secure the shaft of the belly putter 4-4 for play. Cap 8 is also screwed in place and the set screw 16 of shaft for the belly extender 4-4 is tightened with an Allen wrench to secure the cap 8 and the belly putter is complete and ready for play. Cap 8 is again removed using the Allen Wrench and the shaft for the chest putter 4-6 can be installed. The shaft for the chest putter extender 4-6 is assembled as follows: a male coupler 12 is affixed with shaft epoxy to the inside of the lower end of shaft 4-6 and a female coupler 10 is affixed with shaft epoxy to the inside of the upper end of shaft 4-6. The threaded set screw tap 14 is aligned with the hole in shaft 4-6. A set screw 16 is used to align the set screw holder 18 to the female coupler 10 in shaft 4-6. The set screw holder 18 is affixed with super glue to the proper location on shaft 4-6. Remove set screw 16 using an Allen wrench and install the grip for the chest putter 6-6 to the shaft for the chest extender 4-6 with the hole 20 aligned with the set screw holder 18. The shaft for the chest putter 4-6 is now ready to be screwed into the of the belly extender 4-4. After shaft 4-6 has been tightly screwed in place the set screw 16 of shaft for belly putter 4-4 is tightened using an Allen wrench to secure the shaft for the chest putter 4-6 for play. Cap 8 is now screwed in place at the upper end of shaft 4-6 and set screw 16 of shaft for the chest putter 4-6 is tightened using an Allen wrench to secure the cap 8 and the chest putter is complete and ready for play. Disassembly of each unit for storage or reuse is a reverse process, where the set screws 16 are loosened and each extender and cap 8 are removed. The hand or belly putter can generally be stored in the golf bag as assembled, however, the chest extender is normally removed and stored in the bag separately for shipping.

Operation

Main Embodiment

The hand putter comprising the putter head 2 and the grip assembly shaft 4-2 and grip 6-2 with cap 8 are of a standard length for the respective golfer. The length is determined by the golfer measuring the club to fit their physique. A method of measurement is provided each purchaser of the "Three In One Putter". A brief description of the measurement process is provided here. The golfer will place a putter head or simulation thereof on the ground directly below their eyesight having their body bent at the waist and their knees slightly bent. The hands are let to hang vertically and the distance from the putter head to the heel of the top hand is measured. Distance from the point vertically below the hands to the simulation of the putter head is measure and the distance from the ground to the heel of the hands is measured. With allowance for thickness of the club head and a small amount above the heel of the hands you can calculate the length of the hand putter shaft. The grip is completely rounded and of such length to give the golfer some latitude in hand placement. One should grip the club gently with the hands in the desired position. Some golfers prefer the right hand placed below the left hand, however, cross handed may also be used, with the left hand low and right hand high. Each golfer is directed to place the putter head 2 vertically below their eyesight and swing the putter head 2 along a path parallel to the intended alignment of the ball movement. A pendulum swing is desired, but that is entirely up to the golfer. The parallel strips and the hole behind the putter face 2-2 are used to assist the golfer in maintaining the putter face 2-2 perpendicular to the line of the intended ball movement. The length of the putt is governed by the momentum created in the pendulum swing.

A belly putter uses the hand putter with shaft 4-4 and grip 6-4 assembly fastened thereto. A measurement is made from the end of the hand putter, without the cap, to the point on the body near the belly button where the extender is intended to be placed. The cap 8 is added and this determines the length of the belly extender. Now the butt end of the belly putter extender is placed gently against the golfers body at or near the belly button. The hands grip the club in a position very similar to the hand putter. The putter pressed against the belly acts as a fulcrum point to control the pendulum swing. Each golfer is directed to place the putter head 2 vertically below their eyesight and swing the putter head 2 along a path parallel to the intended alignment of the ball movement. A pendulum swing is desired, but that is entirely up to the golfer. The parallel strips and the hole behind the putter face 2-2 are used to assist the golfer in maintaining the putter face 2-2 perpendicular to the line of the intended ball movement. The length of the putt is governed by the momentum created in the pendulum swing.

A chest putter uses the combination of the hand putter shaft 4-2 and grip 6-2 plus the shaft 4-4 and grip 6-4 assemblies fastened together. The chest putter extender is measured from the end of the belly extender, with the cap 8 removed, to a point on or near the sternum. Because the combination shaft is made from a long putter shaft the angle from vertical is close to perfect. The sole of the putter 2-10 is curved to allow the golfer to move the putter head 2 in or out to accommodate the placement of the putter head 2 vertically directly below the eyesight for putt alignment. For the right handed golfer the left hand is place at or near the butt end of the putter assembly. The right hand is placed at or near the join line of the hand putter grip 6-2 and the belly putter grip 6-4. Again because the grips are of equal size placement of the right hand is adjustable. Here again the swing is pendulum in nature and the strips and ball hole of the putter head 2 assist the golfer in maintaining the putter face 2-2 perpendicular to the line of the intended ball movement. The length of the putt is governed by the momentum created in the pendulum swing.

Description and Operation

Alternative Embodiment

Because the golfer can use different lengths of extenders gripping the club can be adjusted to meet their needs. Different putter heads may also be used if desired by the golfer, however, they must have the ability for the shaft to be mounted vertically in the putter head. A putter head should have a weight close to 390 grams.

CONCLUSION, RAMIFICATION, AND SCOPE

The hand, belly or chest putter are each individual units, however, the extenders of the belly and chest putters are interchangeable giving the golfer choices as to the length of the belly putter. Special orders may be made for different lengths of extenders and grips.

The hand putter with shaft 4-2 is of standard length and has a rounded grip. Grips may be ordered for the hand putter that have a rounded back and a flat front where the thumbs may be placed for controlling the putting stroke. The top of the grip is returned to the round shape in order to match the belly and chest putter extenders. A pendulum swing is preferred, however, the golfer has the option of alternate methods of swinging the club.

In the Rules of Golf No. 4 it states that a golf club cannot be altered during a round of golf. The primary purpose of the set screw 16 is to hold the golf club units tightly in place during a round of golf. They should not be adjusted during the round of golf. A club is chosen and that unit must be used throughout that round of golf. All other extenders should be left behind.

Each of the various elements used in the assembly of the golf club are made by different manufactures.

Construction of the putter requires an experienced club maker having the required tools and equipment. Once all the parts are available the club maker needs to properly align each element and epoxy or glue them in place. Grips are affixed using standard grip tape and may be re-griped by a shop or user with the proper tools.

One option for the golfer is to switch the belly and chest units giving the golfer a longer belly putter for use like a chest putter.

Any grip may be specialized to meet the needs of the golfer, for example a shorter grip for the chest putter, however, the designed units all have full length grips making them interchangeable and matching when put together.

The primary use of this invention is to give the user the opportunity to purchase one putter with three configurations and then to use it in any form for practice and then after gaining proficiency using that unit in a round of golf.

The invention claimed is:

1. A golf putter shaft comprising a hand putter section, a belly extender section, a chest extender section and a brass cap, each of the three sections have a grip, the hand putter section is step-less made of stainless steel or chrome plated steel with the grip made of light weight soft foam rubber, the grip is totally round or a rounded back with a flat front surface expanded at the top to match a rounded grip of the grip on the belly extender section, the belly extender section is uniform in diameter throughout its entire length with the belly extender section grip being of soft foam rubber round in shape for the entire length of the grip, the chest extender section is uniform in diameter throughout its entire length with the chest extender section grip being of light weight soft foam rubber for the entire length of the grip, and the cap is rubber coated brass and is able to fit in an end of each section, wherein each section is distinct and able to be separated from each of the other sections, and wherein all three sections are able to be attached together at the same time forming the putter shaft.

2. The golf putter shaft of claim 1 wherein the sections are connected together using brass couplers, a female threaded coupler or a male threaded coupler at each of the ends of the belly extender section and the chest extender section, a female coupler at the end of the hand putter section, and the cap has a male threaded end.

3. The golf putter shaft of claim 2 wherein the couplers are secured in place with the sections with epoxy.

4. The golf putter shaft of claim 2 wherein the couplers for each section are secured to the coupler in the other section by tightly screwing them together and then held in place with a set screw.

5. The golf putter shaft of claim 4 wherein the set screw is held in place by a set screw holder that is glued to each section, the female coupler has a threaded tap for the set screw.

6. The golf putter shaft of claim 5 wherein the sections have a hole drilled into at the location where the tap in the female coupler is positioned, another hole is placed in each grip that aligns with the set screw holder and the tap in the female coupler.

7. A golf putter shaft comprising a hand putter section, a belly extender section, a chest extender section, each of the three sections have a grip made of soft material, wherein each section is distinct and able to be removably attached with each of the other sections, and wherein all three sections are able to be attached together at the same time forming the putter shaft.

* * * * *